United States Patent [19]
Magome

[11] Patent Number: 5,566,128
[45] Date of Patent: Oct. 15, 1996

[54] SEMICONDUCTOR MEMORY DEVICE

[75] Inventor: Koichi Magome, Hiratsuka, Japan

[73] Assignee: Kabushiki Kaisha Toshiba, Tokyo, Japan

[21] Appl. No.: 388,661

[22] Filed: Feb. 14, 1995

[30] Foreign Application Priority Data

Feb. 18, 1994 [JP] Japan .................................. 6-020939

[51] Int. Cl.[6] ................................................. G11C 8/00
[52] U.S. Cl. ..................... 365/230.06; 365/200; 365/96; 365/225.7
[58] Field of Search .................................... 365/200, 201, 365/230.06, 96, 225.7

[56] References Cited

U.S. PATENT DOCUMENTS

| | | | |
|---|---|---|---|
| 5,134,583 | 6/1992 | Matsuo et al. | 365/200 |
| 5,349,558 | 9/1994 | Cleveland et al. | 365/200 |
| 5,377,146 | 12/1994 | Reddy et al. | 365/200 |

Primary Examiner—Tan T. Nguyen
Attorney, Agent, or Firm—Loeb & Loeb LLP

[57] ABSTRACT

A memory has a first bit line pair, a second bit line pair, a third bit line pair, a first data line pair, a second data line pair, a first transistor pair connecting the first bit line pair to the first data line pair, a second transistor pair connecting the second bit line pair to the second data line pair, a third transistor pair connecting the third bit line pair to the first data line pair, a fourth transistor pair connecting the third bit line pair to the second data line pair, a first selection line connected to the first transistor pair for switching ON/OFF of the first transistor pair, a second selection line connected to the second transistor pair for switching ON/OFF of the second transistor pair, a third selection line connected to the third transistor pair for switching ON/OFF of the third transistor pair, and a fourth selection line connected to the fourth transistor pair for switching ON/OFF of the fourth transistor pair.

21 Claims, 14 Drawing Sheets (j=0,1,2,3)

SEMICONDUCTOR MEMORY DEVICE

BACKGROUND OF THE INVENTION

1. Field of the Invention

The present invention relates to a semiconductor memory device for a highly-integrated Dynamic Random Access Memory (DRAM) or the like which operates at high speed, and, in particular, to a low-cost semiconductor memory device which can be operated in a block write mode, wherein the number of spare columns is less than the number of columns which are a block unit when in the block write mode, and wherein an increase in the chip area of the semiconductor memory device can be decreased.

2. Description of the Prior Art

Because a DRAM used as a random access port section for an image memory is used as a frame buffer in which display data to be displayed is saved, a function for rapidly rewriting data is required. One function which satisfies this requirement is a block write mode.

The block write mode can be defined as a mode for writing data items into a plurality of columns simultaneously, in the case where lowest N bits (where N is an integer, 1 or greater) of a column address for the DRAM entered from an external section are irrelevant.

It is also possible for each column to be selectively masked (not written into) in the block write mode.

FIG. 1 is a diagram for roughly explaining a memory cell section including spare columns, and for explaining the relationship between data lines which connect the memory cell section with peripheral sections, column decoders, column decoder lines, and column addresses, in a DRAM which includes functions such as the block write mode described above.

In FIG. 1, the data lines DQ0 to DQ3 are normally complementary lines, and each of the data lines DQ0 to DQ3 is formed as a pair of unit lines. However, to avoid complications, each pair of data lines is shown as one line in FIG. 1. Also, for simplicity, the number of I/Os of data is one and the number of columns is 16 columns in the following explanation. In addition, the number of columns in the block write mode is four columns in order to write four data items into the memory cells at the same time, where the required column addresses are A0C to A3C and inverted phase signal of the column addresses are /A0C to /A3C.

The reference numeral 100 designates a DQ buffer connecting the memory cell section and the peripheral section. The DQ buffer 100 decodes and amplifies data from a memory cell in the memory cell section and transmits this data to an output buffer 300 in the peripheral section via a read-out data line 30. The DQ buffer 100 can also decode and amplify data from an input buffer 200 in the peripheral section and write this data into a memory cell. The written-in data is provided to the DQ buffer 100 from the input buffer 200 via a write-in data line 20. The DQ buffer 100 drives the data line pairs DQ0 to DQ3.

However, four pairs of data lines are required during block write mode because four columns must be masked independently. In the case where four columns are all written into without being masked, the four pairs of data line pairs DQ0 to DQ3 are all driven. The data line pairs corresponding to these columns are not driven under the control of the DQ buffer 100 when there is a column to be masked.

FIGS. 2A, 2B and FIGS. 3A, 3B are circuit diagrams for column decoders NCD0, NCD1, ..., NCD3 and a spare column decoder SCD.

In the case of a later-described read/write mode for one bit, the column decoder system has the following configuration in order to reduce current consumption in idle data line pairs. Specifically, two columns are selected through each of column selection lines CSL0 to CSL7 and spare column selection lines SCSL0 and SCSL1 two columns.

The last two bits A1C and A0C in a column address signal are converted to partial column decoding address signal Y0 to Y3 by a partial column decoder CPD shown in FIGS. 4A and 4B and transmitted to the DQ buffer 100, then one pair is selected from the four decoder line pairs 50. The last second to last bit A1C in a column address signal together with a block write mode signal BW, which changes to a high potential level during only the block write mode.

The operation of the conventional semiconductor memory device as a conventional example will now be explained.

When the block write mode is selected, the block write mode signal BW is changed to the high potential from a low potential. As can be understood from FIGS. 2A and 2B, there is no relation to the column address signals A1C and /A1C because a column decoder control signal CSP, which is transmitted into a three input NAND gate in the column decoder NCDm to be selected (where m=0, 1, ..., 3), is at the high potential level, therefore in spite of values of the voltage potentials of the column address A1C and /A1C, both a column selection line CSL2m and a column selection line CSL2m+1 (where m=0 to 3) are selected together.

In addition, as can be understood from FIGS. 4A and 4B, during the block write mode, the data from the write-in data line 20 is transmitted to four data line pairs 50 without being decoded in the DQ buffer 100, irrespective of the lowest two bits A1C and /A1C in the column address signals, because the partial column decoder address signals Y0 to Y3 supplied to the DQ buffer 100 are all at the high potential. At this time, the column selection line CSL2m and the column selection line CSL2m+1 are selected together so that the write-in data is finally written into the four columns. In this case, four of the data line pairs DQ0 to DQ3 are charged and discharged together.

Next, the operation of the conventional semiconductor memory device during a normal one-bit read/write mode will be outlined. In the case of the one-bit read/write mode, the column address having all bits (A0C to A3C and /A0C to /A3C) are transmitted. Also, the block write mode signal BW is at the low potential.

The reason is that either the column selection line CSL2m or the column selection line CSL2m+1 is selected in accordance with the potential of the column address signals A1C and /A1C, as can be understood from FIGS. 2A and 2B. Also, as can be understood from FIGS. 4A and 4B, because the block write mode signal BW is at the low potential in accordance with the potential of the two lowest bits A1C and A0C in the column address signal, only one of the partial column decoder addresses Y0 to Y3 supplied to the DQ buffer 100 is at the high potential, therefore the specified decoding operation is performed by the DQ buffer 100.

For example, in the case of the read mode, when one of the column selection lines CSL is selected, data items of two columns are read from two groups of data line pairs. Then, the decoding of the remaining column addresses is implemented by the DQ buffer 100, and finally only data of one column is read out to the data line 30. In addition, nothing is done to the remaining two columns belonging to the column selection lines CSL which are not selected.

Also, in the write mode, data from the write-in data line 20 is supplied to the DQ buffer 100, then the two lowest bits A1C and A0C of the column address signal are decoded, and write-in data is transmitted to only one of the data line pairs. This data is written into the memory cell corresponding to the provided address via the selected column selection line CSL.

Finally, data in the memory cell corresponding to the same column selection line CSL and the one remaining unselected column is read out to a data line pair.

In addition, nothing is done with the remaining two columns belonging to the unselected column selection lines CSL.

Accordingly, the current consumption of the data line pairs is reduced by half in comparison with the case in block write mode, because there are only two data line pairs in both the read and write operations.

In this manner, the charging and discharging of unnecessary data line pairs are avoided, with the result that an increase in the current consumption can be decreased by changing the number of column selection lines CSL selected in the block write mode and other modes.

In the foregoing explanation, n, the number of I/Os, is assumed to be 1 in order to simplify the explanation, but in practice, n is not limited to 1. Also, in the above explanation the number of columns is taken as 16, and an example is given wherein the number of columns per one column selection line CSL in a four column block write mode is two columns. However, in principle, any number of columns and any number of block write columns may be used.

As outlined above, this conventional example is basically a circuit configuration corresponding to the block write mode, and, depending on the mode such as the read/write mode, is an example of a circuit configuration by which it is possible to reduce current consumption.

However, problems are produced in accordance with the increase in the number of columns for block write mode and the number of I/Os. These problems will now be described. Normally, in a semiconductor memory device, defects develop which are attributable to the memory cells, word lines and bit lines, or the like. As a result of these defects, redundant cells (spare rows, spare columns) are provided to counter a drop in yields. For example, if defects are produced in a certain column, the address of this defective column is programmed in advance in a comparator, and in the case where a column address provided from an external device and the programmed address are in agreement, a number of columns including this defective column are replaced by spare columns and then accessed.

There are no particular criteria as to which columns are provided as spare columns. There are cases where this number is determined as a function of the memory. For example, FIG. 1 is a general configuration drawing showing spare columns and a spare column selection line system for a conventional DRAM in which a four-column (N=2) block write function is provided. In this case, four columns (SCOL0 TO SCOL3) are required as spare columns to access four columns together during block write mode.

Below, an explanation will be given for an example of operation in the case where a defective column is present in the conventional semiconductor memory device, with reference to FIGS. 2A, 2B and FIGS. 3A, 3B. For simplification, a column COL0 is taken as the defective column, and the explanation assumes that a switch to the spare column occurs when the column address signals A3C to A0C= "0000B" (the appended letter B indicates binary display).

During block write mode, because the two lowest bits A1C and A0C of the column address signals are immaterial, fuses F2a to F3b in a spare column decoder SCD which is a defective address comparator, as shown in FIGS. 3A and 3B, are also provided in series with transistors Ftr2a, Ftr2b, Ftr3a, and Ftr3b to which the remaining upper address signals A3C and A2C are transmitted together with complementary signals /A3C and /A2C of the remaining upper address signals as gate inputs of the transistors Ftr2a to Ftr3b. a fuses which changes to the high voltage potential level only when the defective address is transmitted, the fuses at the high potential is cut. In this conventional example, the fuses F3a and F2a of the column address signals /A3C to /A2C are cut.

First, an operation under the block write mode will be explained when address signals transmitted from an external device designate the defective column in the block write mode.

Prior to providing column address signals, a negative logical OR (a NOR) node /N in the spare column decoder SCD is precharged to the high potential level by a spare column decoder internal node charging signal PRCH. Because the provided column address signals A3C to A2C ="00B", the NOR node /N keeps at the high potential level. Accordingly, a normal column decoder signal CSP changes to the low potential level so that the column selection lines CSL0 and CSL1 (in this case m=0) are not selected. Instead, the NOR node /N and the block write mode signal BW are at the high potential level. Therefore, in spite of potential levels of the column address signals /A1C and A1C, both the spare column selection lines SCSL0 and SCSL1 are selected, and the data on the data line pair 50 not decoded by the DQ buffer 100 is written into the spare columns SCOL0 to SCOL3.

Next, a provided column address contains a defective column, and an example of the operation for the write mode for one bit will be described. Because the provided column address signals A3C to A0C="0000B", the NOR node /N in the spare column decoder SCD keeps at the high potential level. Accordingly, the normal column decoder control signal CSP is at the low potential level, and the column selection lines CSL0 and CSL1 corresponding to the normal column are not selected. Because the block write mode signal BW is at the low potential level, the spare column selection line SCSL0 is selected to be the column selection line CSL in accordance with the column address A1C="0B". Therefore the data in one pair within the data line pairs 50 selected by the column address signal A1C=A0C="0B" is written into the spare column SCOL0. The operation for the address is the same even in the case of a one bit read mode, and is therefore omitted here.

As outlined above, in a conventional semiconductor memory device, for example, even in the case where there is a defective column, there is no problem from the operational point of view in substituting a spare column for the defective column. However, in order to perform the above-described operation correctly, it is necessary to add the same number of spare columns to the normal columns as the number of columns which are a block unit during the block write mode.

In an image memory, it is foreseen that, in future, more and more I/Os will be added (multi-bits) and there will be an increase in the number of columns (which form a block unit) during the block write mode in order to increase a data processing performance of a semiconductor memory device. At the same time, because there will also be an increase in spare columns, the chip area will be increased more than necessary, and, as a result, the problems of decreased yield and an increase in cost will occur.

SUMMARY OF THE INVENTION

Accordingly, an object of the present invention is, with due consideration to the drawbacks of such a conventional semiconductor memory device, to provide a low cost semiconductor memory device which can handle the block write mode, wherein the number of spare columns is smaller than the number of columns in a block unit during block write mode, and any increase in chip area is kept to a minimum.

As a preferred embodiment of the present invention, a semiconductor memory device comprising:

a first bit line pair;

a second bit line pair;

a third bit line pair;

a first data line pair;

a second data line pair;

a first transistor pair connecting the first bit line pair to the first data line pair;

a second transistor pair connecting the second bit line pair to the second data line pair;

a third transistor pair connecting the third bit line pair to the first data line pair;

a fourth transistor pair connecting the third bit line pair to the second data line pair;

a first selection line connected to the first transistor pair for switching ON/OFF of the first transistor pair;

a second selection line connected to the second transistor pair for switching ON/OFF of the second transistor pair;

a third selection line connected to the third transistor pair for switching ON/OFF of the third transistor pair; and a fourth selection line connected to the fourth transistor pair for switching ON/OFF of the fourth transistor pair.

In the semiconductor memory device described above, each of the first bit line pair and the second bit line pair is selected, and the third bit line pair is selected instead of one of the first bit line pair and the second bit line pair.

In the semiconductor memory device described above, four pairs of the first bit line pair and the second bit line pair are selected at the same time, and two pairs of the third bit line pair are selected instead of two pairs of the first bit line pair and the second bit line pair.

In the semiconductor memory device described above, predetermined number pairs of the first bit line pair and the second bit line pair are selected at the same time, and half number pairs' of the third bit line pair of the predetermined number pairs of the first bit line pair and the second bit line pair are selected instead of the half number pairs of the predetermined number pairs of the first bit line pair and the second bit line pair.

The semiconductor memory device described above, further comprises a decoder comprising a plurality of fuses, wherein the decoder selects one of both of the first bit line pair and the second bit line pair, both of the first bit line pair and the third bit line pair, or both of the second bit line pair and the third bit line pair according to blown states of the plurality of fuses.

The semiconductor memory device described above, further comprises a sense amplifier circuit provided on each of the first to third bit line pairs, the sense amplifier circuit comprises a first pair of transistors including a first transistor and a second transistor, and a second pair of transistors including a third transistor and a fourth transistor, each of the first pair of transistors and the second pair of transistors are connected between each of the first to third bit line pairs, gates of the first and third transistors are connected to one of bit lines in each of the first to third bit line pairs, and gates of the third and fourth transistors are connected to the other bit line in each of the first to third bit line pairs.

The semiconductor memory device described above, further comprises an equalizer circuit provided on each of the first to third bit line pairs, the equalizer circuit comprises first and second transistors which are connected in series, the first transistor is connected to one of the bit lines in each of the first to third bit line pairs, and the second transistor is connected to the other bit line in each of the first to third bit line pairs.

The semiconductor memory device described above, further comprises a plurality of memory cells, each of the plurality of memory cells is connected to each bit line in each pair of the first to third bit line pairs.

The semiconductor memory device described above, further comprises a plurality of word line pairs, one word line in each pair of the word line pairs is connected to the one memory cell connected to the one bit line in each pair of the first to third bit line pairs.

The semiconductor memory device described above, further comprises a spare column decoder, the spare column decoder comprising:

a plurality of input terminals through which the column address is received;

a common line, a plurality of fuses connected between the common line and the plurality of input terminals; and a plurality of transistors, each transistor connected between each of the plurality of fuses in series and each of the plurality of input terminals, wherein the spare column decoder receives a column address and generates a bit line selection control signal to select following cases (1) to (3), which are determined by cutting the plurality of fuses, through the first to fourth selection lines according to a voltage potential level of the common line:

(1) both the first bit line pair and the second bit line pair, (2) both the first bit line pair and the third bit line pair, and (3) both the second bit line pair and the third bit line pair.

The semiconductor memory device described above, further comprises a buffer, the buffer comprises:

an output buffer for temporarily storing data to be transmitted to an external device;

a fifth transistor pair provided between the first data line pair and the output buffer;

a sixth transistor pair provided between the second data line pair and the output buffer;

an input buffer for temporarily storing data to be transmitted to the first or second data line pair;

a seventh transistor pair provided between the first data line pair and the input buffer; and an eighth transistor pair provided between the second data line pair and the input buffer, wherein data is transferred to/from the first data line pair, the second data line pairs, or both of the first data line pair and the second data line pair, by switching ON/OFF of the fifth to eighth transistor pairs.

The semiconductor memory device described above, further comprises a column address buffer for receiving a column address and a column address latch signal and generates control signals during a low level of the column address latch signal and transmits the control signals to the first to fourth selection lines.

As another preferred embodiment of the present invention, a semiconductor memory device comprises:

a plurality of memory cells comprising a plurality of cells and spare cells, the plurality of cells being divided into cell blocks, each of the cell blocks comprising first and second cell groups, the spare cells being divided to spare cell blocks, the number of the spare cells in each spare cell block is equal to the number of the normal cells in each of the first cell group and the second cell group in each cell block; and a decoder for selecting the spare cell instead of the normal cell to be accessed, and selecting the spare cell block instead of one of the first cell group and the second cell group.

In the semiconductor memory device described above, the number of cells in each spare cell block, the first cell group, and the second cell group is two.

As another preferred embodiment of the present invention, a semiconductor memory device being operable comprises:

a plurality of memory cells comprising a plurality of cells and spare cells, the plurality of cells being divided into cell blocks, each of the cell blocks comprising a first cell group and a second cell group, the spare cells being divided into spare cell blocks, the number of the spare cells in each spare cell block is equal to the number of the cells in each of the first cell group and the second cell group;

a plurality of data bus pairs;

a plurality of bit line pairs, each bit line in each of the plurality of bit line pairs connecting each cell and each spare cell to each data bus in each of the plurality of data bus pairs;

transfer gate pairs provided to each bit line pair to transfer data from/to each cell and to each spare cell;

first column decoder provided to each cell block, for receiving a column address indicating a target cell to be accessed, and switching ON/OFF of the transfer gates provided corresponding to the cell block including a cell to be accessed;

second column decoder provided for the spare cell block to switching ON/OFF of the transfer gate provided corresponding to the spare cell; and a plurality of column selection lines, each selection line connecting the transfer gate to the first column decoder corresponding to each of the first and second cell groups, and the transfer gate to the second column decoder corresponding to the spare cell block, wherein the second column decoder selects the spare cell block instead of the first cell group or the second cell group based on the column address.

In the semiconductor memory device described above, the number of cells in each spare cell block, the first cell group, and the second cell group is two.

In the semiconductor memory device described above, the number of each of the plurality of bit lines pairs, each of the transfer gates, each of the plurality of data bus pairs, each of the plurality of column selection lines is two.

In the semiconductor memory device described above, the number of transistors in each transfer gate of the transfer gate pair for each spare cell is two, a first transfer gate and a second transfer gate, the first transfer gate and second transfer gates are connected to different data buses in the plurality of data buses, and the spare cell decoder switches ON/OFF of both of the first transfer gates or both of the second transfer gates corresponding to the spare cell pairs in each spare cell block at the same time.

In the semiconductor memory device described above, the second column decoder comprises a first spare column decoder and a second spare column decoder, the first spare column decoder and the second spare column decoder receive the column address to select a cell, the first spare column decoder generates a control signal to indicate not to select the cell and transmits the control signal to the first column decoder, and the second spare column decoder generates a control signal to select a spare cell instead of the cell pair to be accessed.

In the semiconductor memory device described above, the first spare column decoder comprises:

a plurality of input terminals through which the column address is received;

a common line, a plurality of fuses connected between the common line and the plurality of input terminals; and a plurality of transistors, each transistor connected between each of the plurality of fuses in series and each of the plurality of input terminals, the first spare column decoder receives a column address and generates a control signal to select following cases (1) to (2), which are determined by cutting the plurality of fuses according to a voltage potential level of the common line:

(1) two cells, and
(2) one cell and one spare cell.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof. Embodiments of the present invention will now be explained with reference to the drawings.

In a semiconductor memory device as a preferred embodiment of the present invention, each bit consists of a pair of bit lines, each of data lines DQ0 to DQ3 consists of a pair of data lines, each of transistors Ntr0 to Ntr15 and Str0 to Str3 consists of a pair of transistors. However, to avoid complications, each pair of bit lines, each pair of data lines, and, each pair of transistors is shown as one in FIG. 5A. Also, for simplicity, the number of I/Os of data is one.

Figure 1:
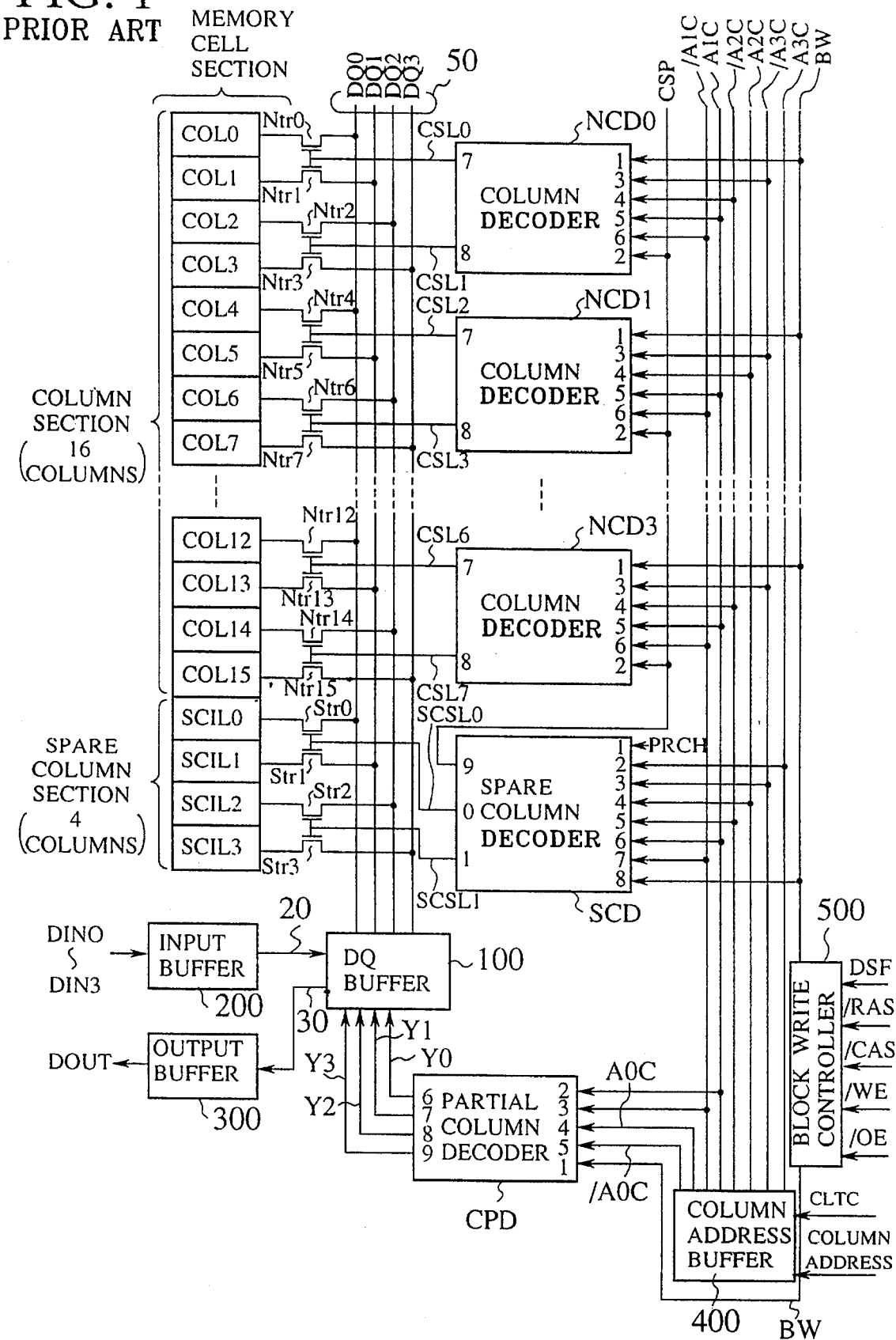
FIG. 1 is a configuration drawing of a conventional semiconductor memory device.
Figure 2A:
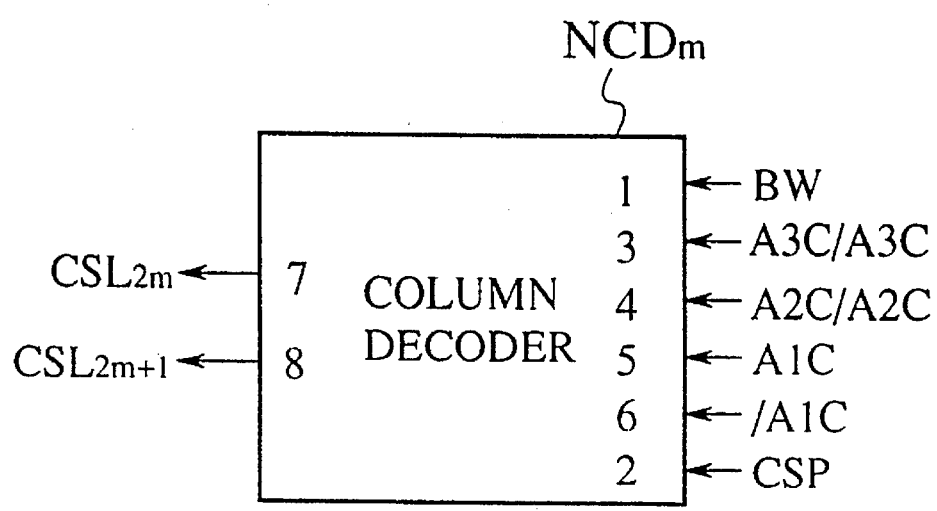
FIG. 2A is a circuit symbol diagram of a conventional column decoder.
Figure 2B:
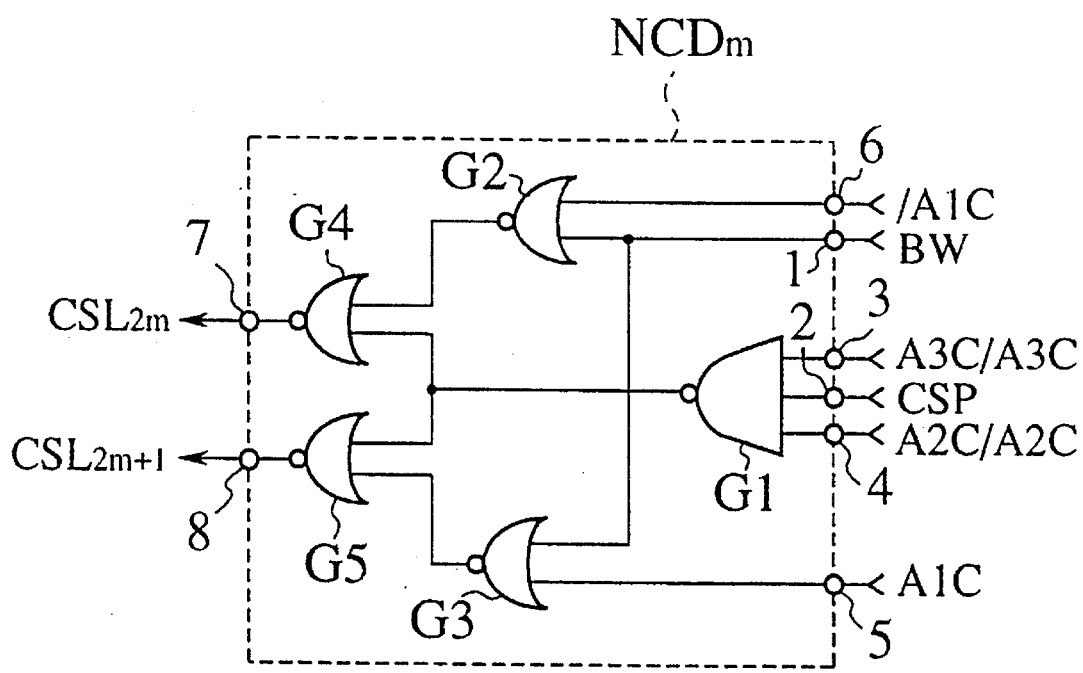
FIG. 2B is a logic circuit diagram of the conventional column decoder shown in FIG. 2A.
Figure 3A:
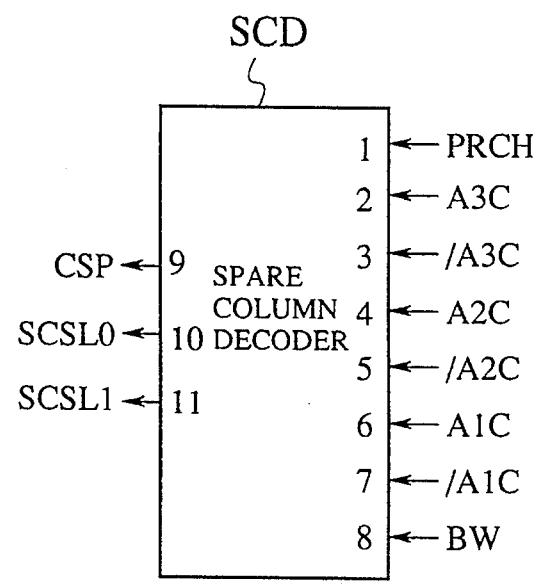
FIG. 3A is a circuit symbol diagram of a conventional spare column decoder.
Figure 3B:
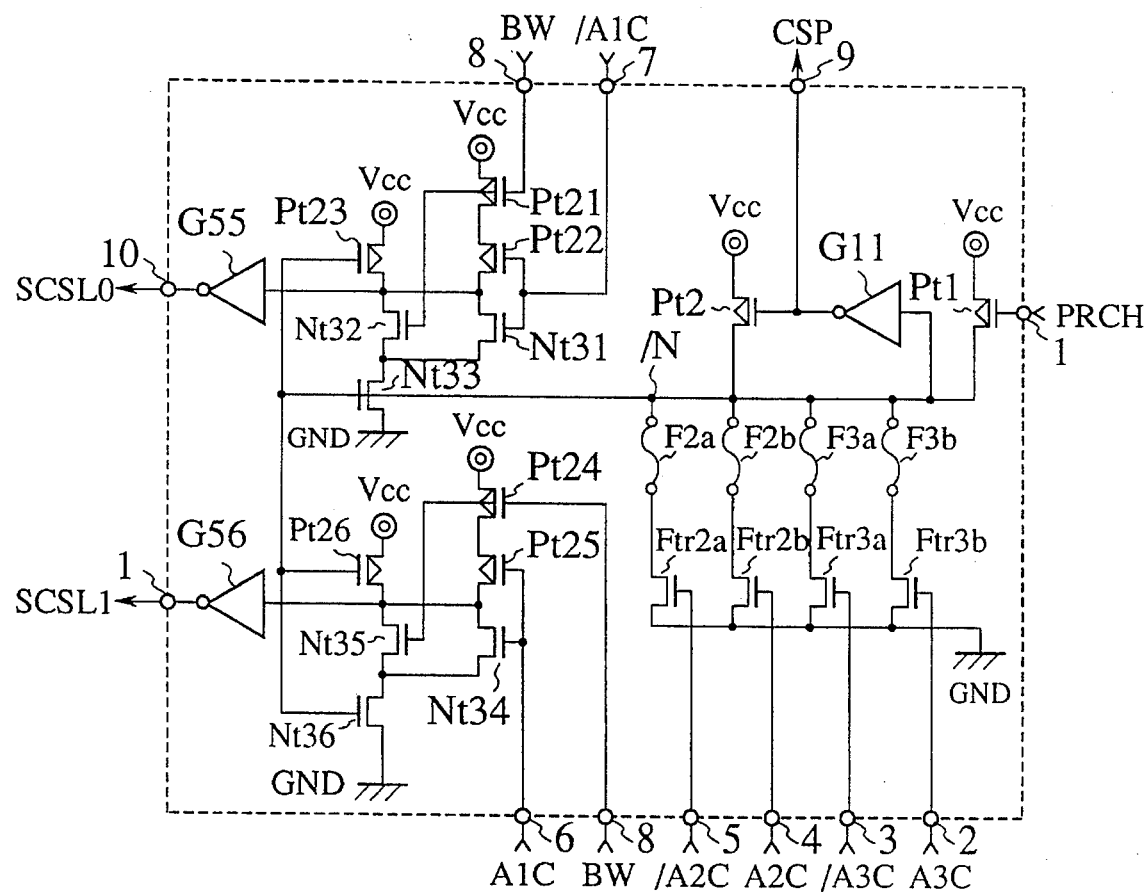
FIG. 3B, is a logic circuit diagram of the conventional spare column decoder shown in FIG. 3A.
Figure 4A:
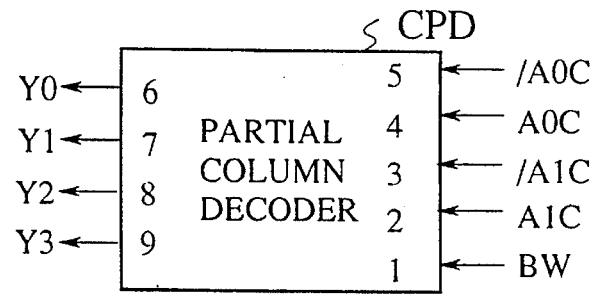
FIG. 4A is a circuit symbol diagram of a conventional partial column decoder.
Figure 4B:
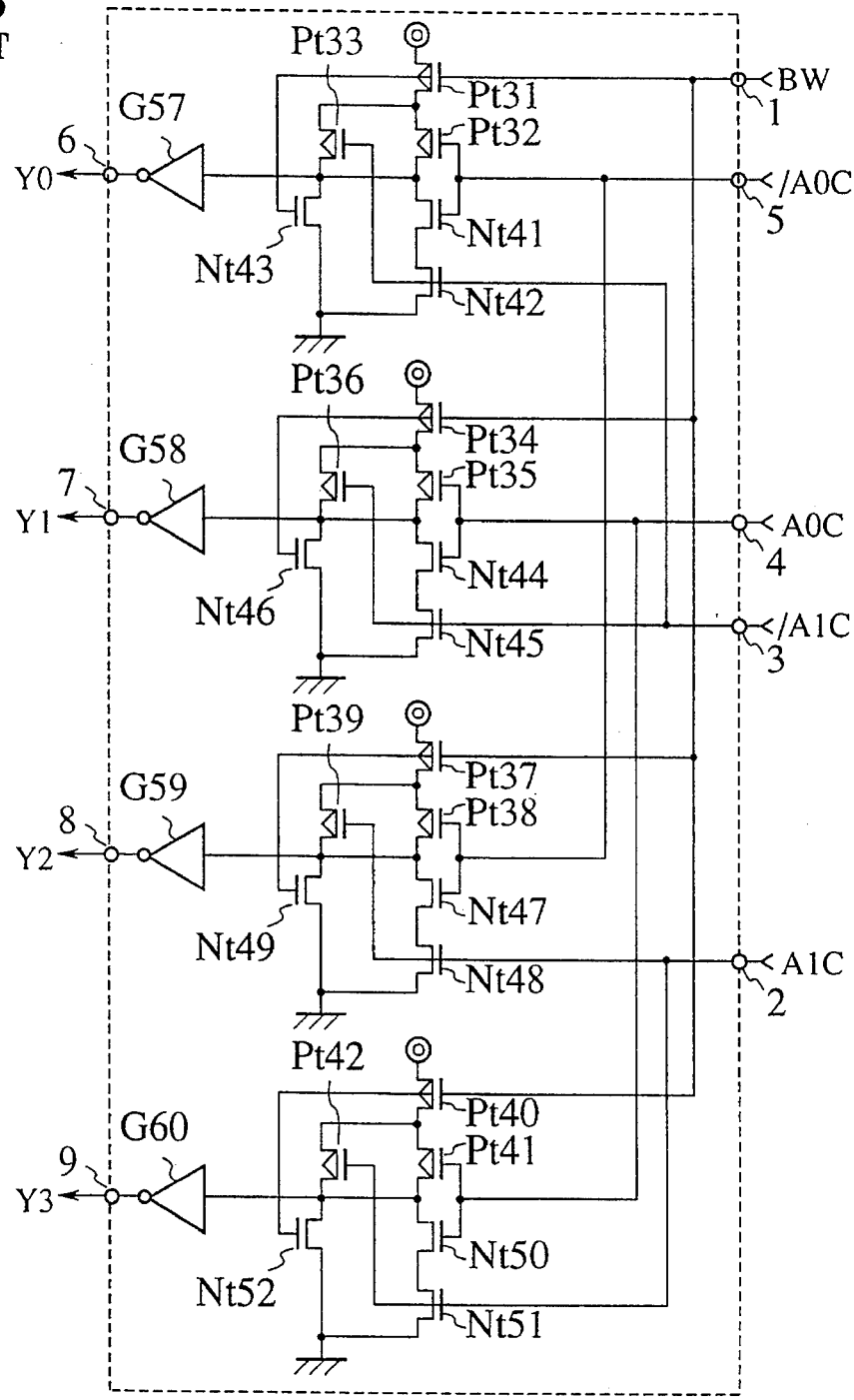
FIG. 4B is a logic circuit diagram of the conventional partial column decoder shown in FIG. 4A.

The decoding operation by the DQ buffer 100 is the same as for the conventional example shown in FIG. 1, therefore the details are omitted here.

Figure 5A:
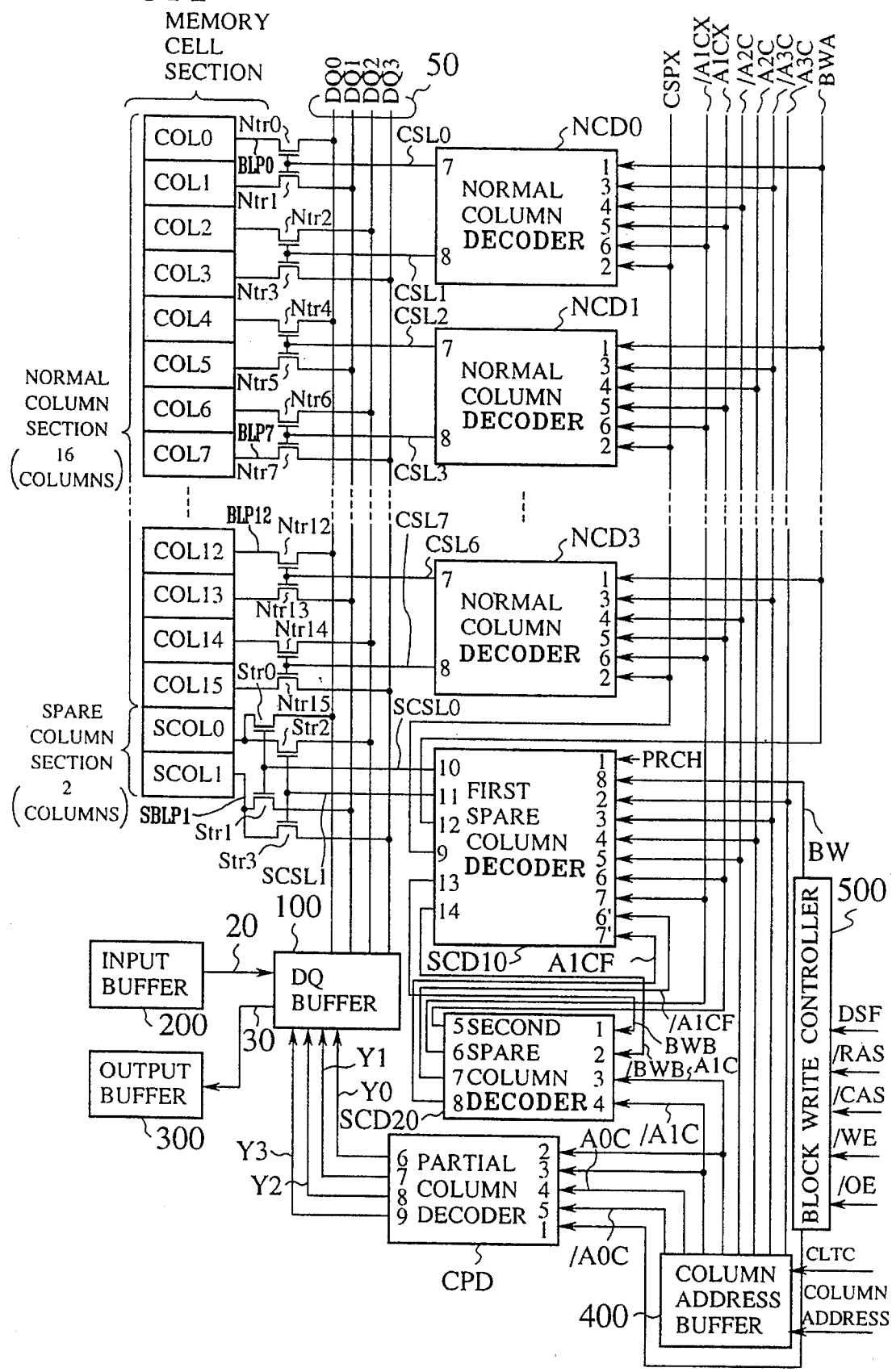
FIG. 5A is a configuration drawing of a first embodiment of a semiconductor memory device of the present invention.

FIG. 5A is a configuration drawing of a first embodiment of a semiconductor memory device of the present invention.

FIG. 5A illustrates the configuration of a normal column, a spare column, a column decoder, and a spare column decoder system. In FIG. 5A, like reference numbers designate parts identical or corresponding to those in the conventional semiconductor memory device shown in FIG. 1, therefore further explanation is omitted.

Figure 5B:
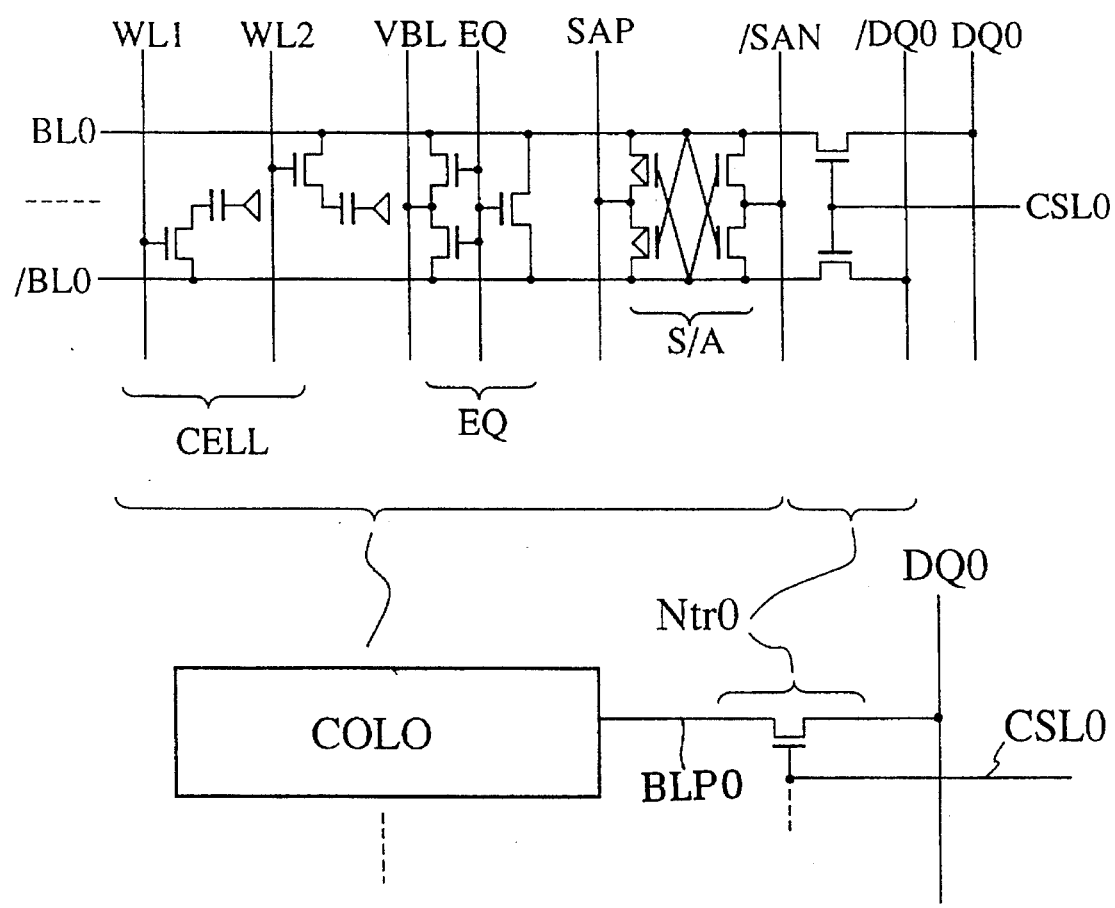
FIG. 5B is a configuration circuit diagram of each of the normal columns shown in FIG. 5A.

FIG. 5B is a configuration circuit diagram of each normal column shown in FIG. 5A. In FIG. 5B, the normal column COL0 comprises a cell to store data, an equalizer EQ, a sense amplifier S/A. The transfer gate Ntr0 is ON/OFF by changing a voltage potential of the column selection line CSL0.

In the semiconductor memory device shown in FIG. 5A, each bit consists of a pair of bit lines, each of data lines DQ0 to DQ3 consists of a pair of data lines, each of transistors Ntr0 to Ntr15 consists of a pair of transistors. However, to avoid complications, each pair of bit lines, each pair of data lines, and, each pair of transistors is shown in FIG. 5B. Also, for simplicity, the number of I/Os of data is one.

Figure 5C:
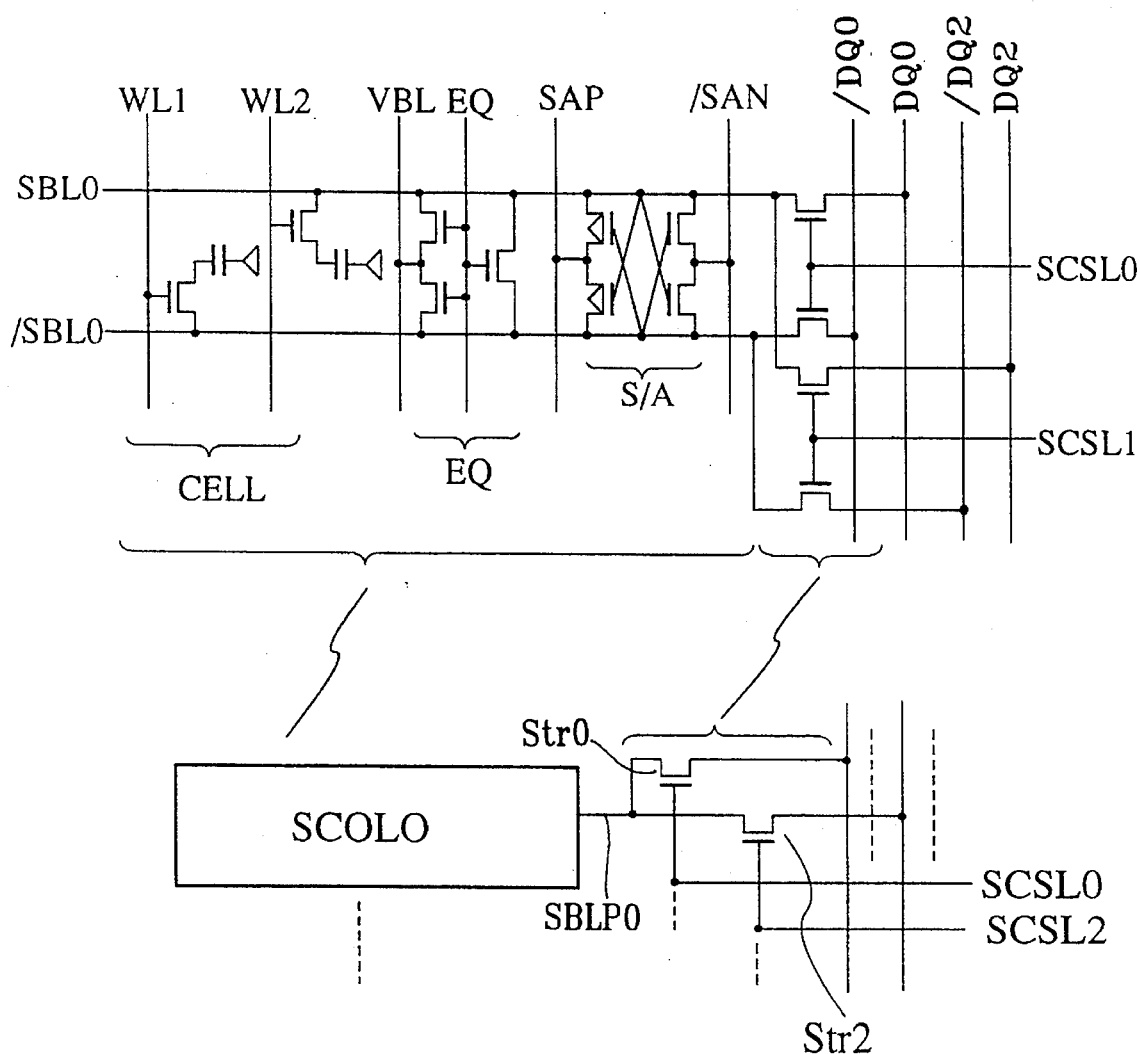
FIG. 5C is a configuration circuit diagram of each of the spare columns shown in FIG. 5A.

FIG. 5C is a configuration circuit diagram of each spare column shown in FIG. 5A. In FIG. 5C, the spare column SCOL0 comprising a cell to store data, an equalizer EQ, a sense amplifier S/A. The transfer gate Str0–Str3 are ON/OFF by changing a voltage potential of the column selection lines SCSL0 and SCSL1. In FIG. 5C, each of transistors Str0 to Str3 consists of a pair of transistors. However, to avoid complications, each pair of transistors Str0 to Str3 is shown in FIG. 5C. Also, for simplicity, the number of I/Os of data is one.

Figure 5D:
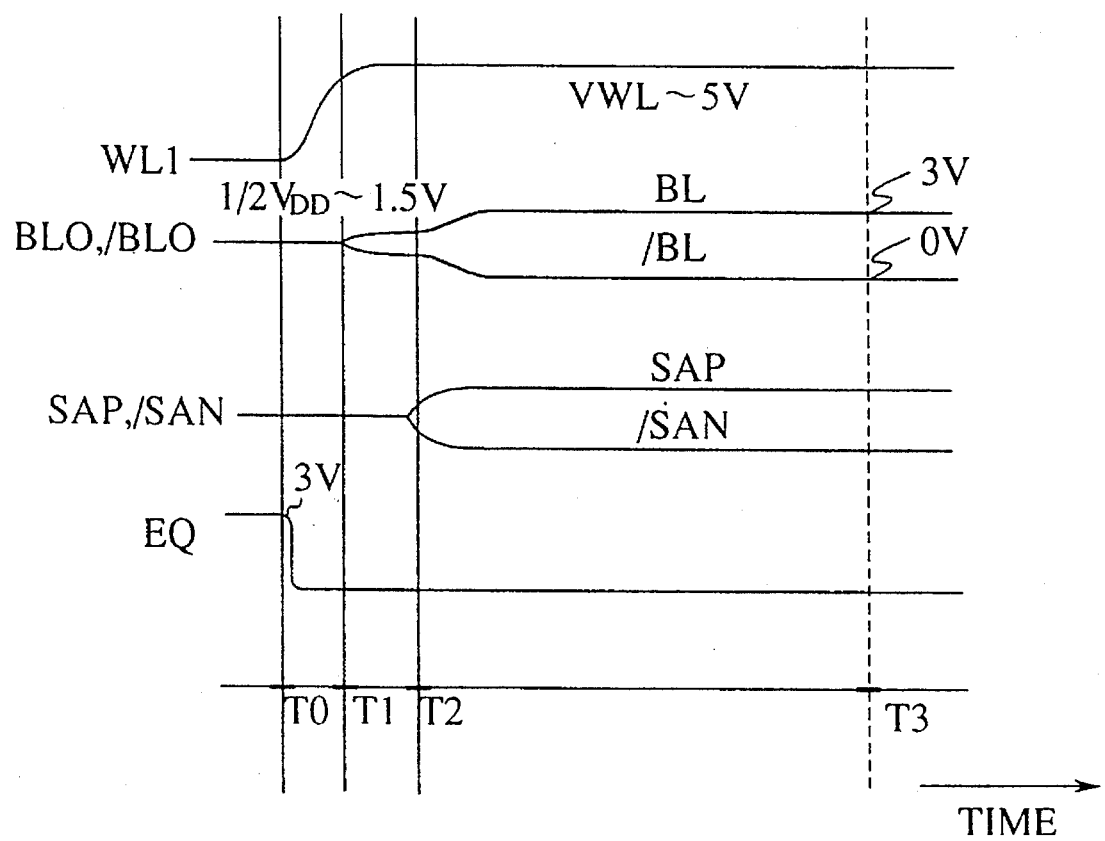
FIG. 5D is a timing chart of a sense operation of data stored in a memory cell.

FIG. 5D is a timing chart of a sense operation of data stored in a memory cell. In FIGS. 5B and 5D, a word line WL1 is selected and an Equalizing operation of a bit line pair BL0 and /BL0 stops at the timing T0. Then, the voltages of the bit line pair BL0 and /BL0 are sensed at the timing T2. Finally, a column gate Ntr0 is ON by changing the column selection line CSL0 to transfer data stored a memory cell to a data lines DQ0 and /DQ0.

In this embodiment, in the same manner as in the explanation of the conventional example, the number of columns is taken as 16 (k=3), the number of block write columns as 4 (N=2), and n, the number of I/Os as 1, to clarify the effect of the present invention. In the configuration of the conventional example shown in FIG. 1 four spare columns were required, but in the configuration of the present embodiment only two columns are needed.

A spare column SCOL0 is connected to data line pairs DQ0 and DQ2 via switching transistors Str0 and Str2 whose gates connect spare column selection lines SCSL0 and SCSL1 which will be later described. In addition, a spare column SCOL1 is connected to data line pairs DQ1 and DQ3 via switch transistors Str1 and Str3 whose gate connect the spare column selection lines SCSL0 and SCSL1.

First, the structural elements of this embodiment will be explained in detail with reference to FIGS. 5 to 11.

In the present embodiment, two types of spare column decoders are provided—a first spare column decoder SCD10 and a second spare column decoder SCD20.

Figures 7A, 7B:
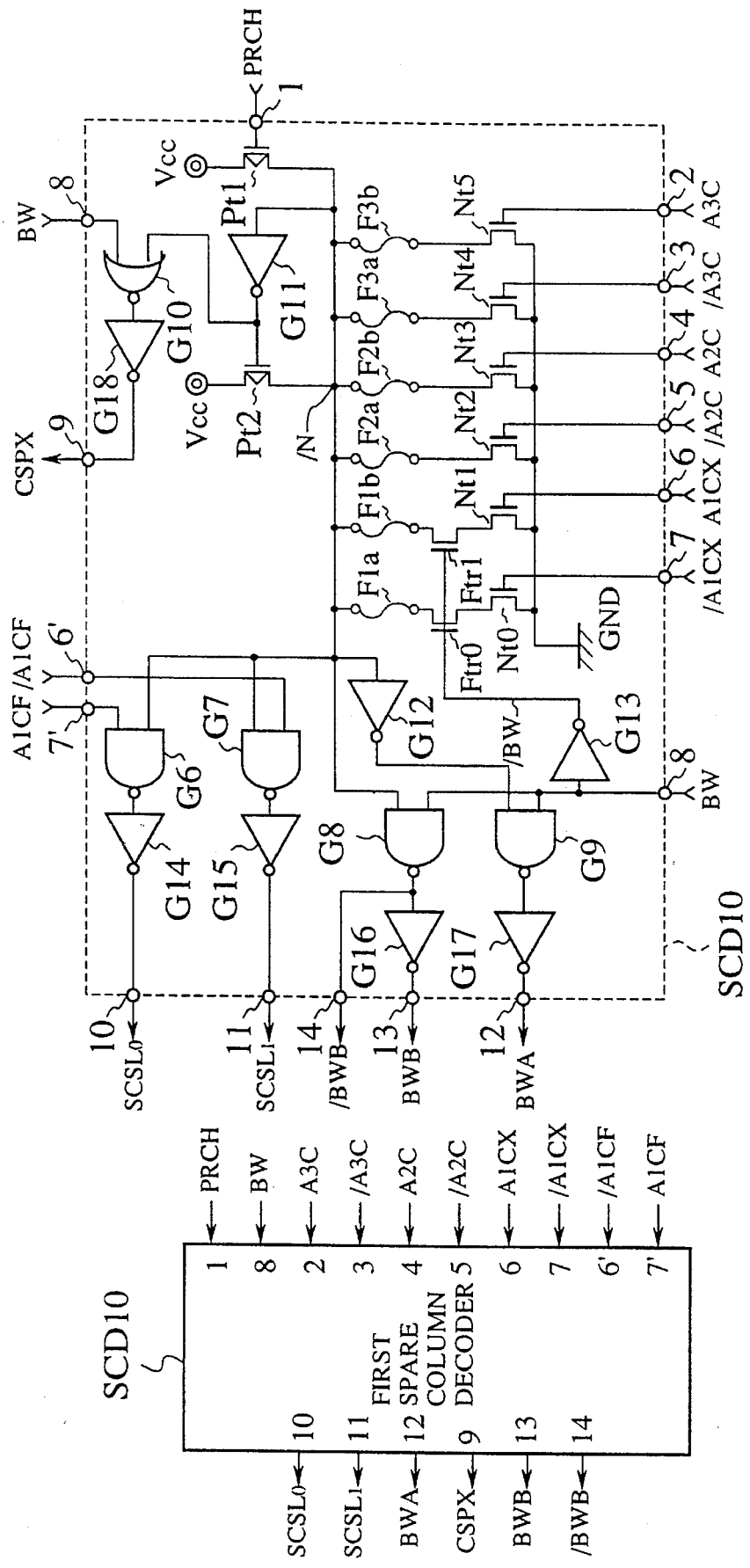
FIG. 7A is a circuit symbol diagram of a first spare column decoder used in the semiconductor memory device shown in FIG. 5A.
FIG. 7B is a logic circuit diagram of the first spare column decoder shown in FIG. 7A.

FIG. 7A is a circuit symbol diagram of the first spare column decoder used in the semiconductor memory device shown in FIG. 5A.

FIG. 7B is a logic circuit diagram of the first spare column decoder shown in FIG. 7A.

The first spare column decoder SCD10 shown in FIGS. 7A and 7B receives address inputs A3C, A2C, A1CX and /A3C, /A2C, /A1CX. Transistors Ftr0 and Ftr1 whose gate receive a block write control signal/BW (which is a reverse signal of a block write mode signal BW) are connected in series to between transistors Nt0 and Nt1 receiving the column address signals A1CX and /A1CX, which are immaterial during a block write mode, and an NOR node /N in the first spare column decoder SCD10.

Among outputs of the first spare column decoder SCD10, a normal column decoder control signal CSPX is a signal logically formed from the block write mode signal BW and the NOR node /N. This normal column decoder control signal CSPX controls the normal column decoder NCDm (where m=0, 1, . . . , and 3)

In addition, block write system control signals BWA and BWB are also signals logically formed from the block write mode signal BW and the NOR node /N, for controlling a normal column decoder NCDm (where m=0, 1, . . . , 3) and the second spare column decoder SCD20.

Figure 8A:
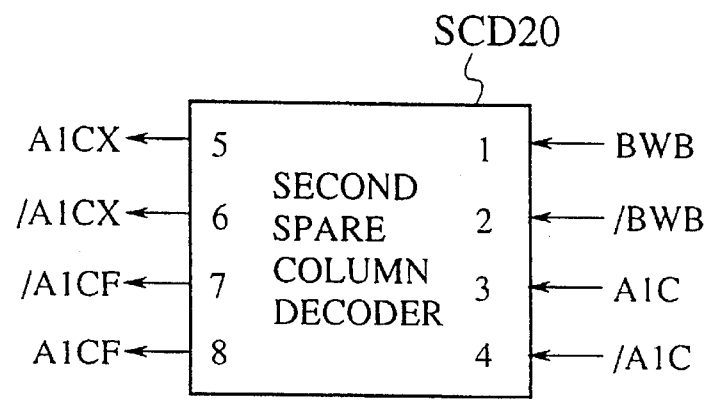
FIG. 8A is a circuit symbol diagram of a second spare column decoder used in the semiconductor memory device shown in FIG. 5A.

FIG. 8A is a circuit symbol diagram of the second spare column decoder used in the semiconductor memory device shown in FIG. 5A.

Figure 8B:
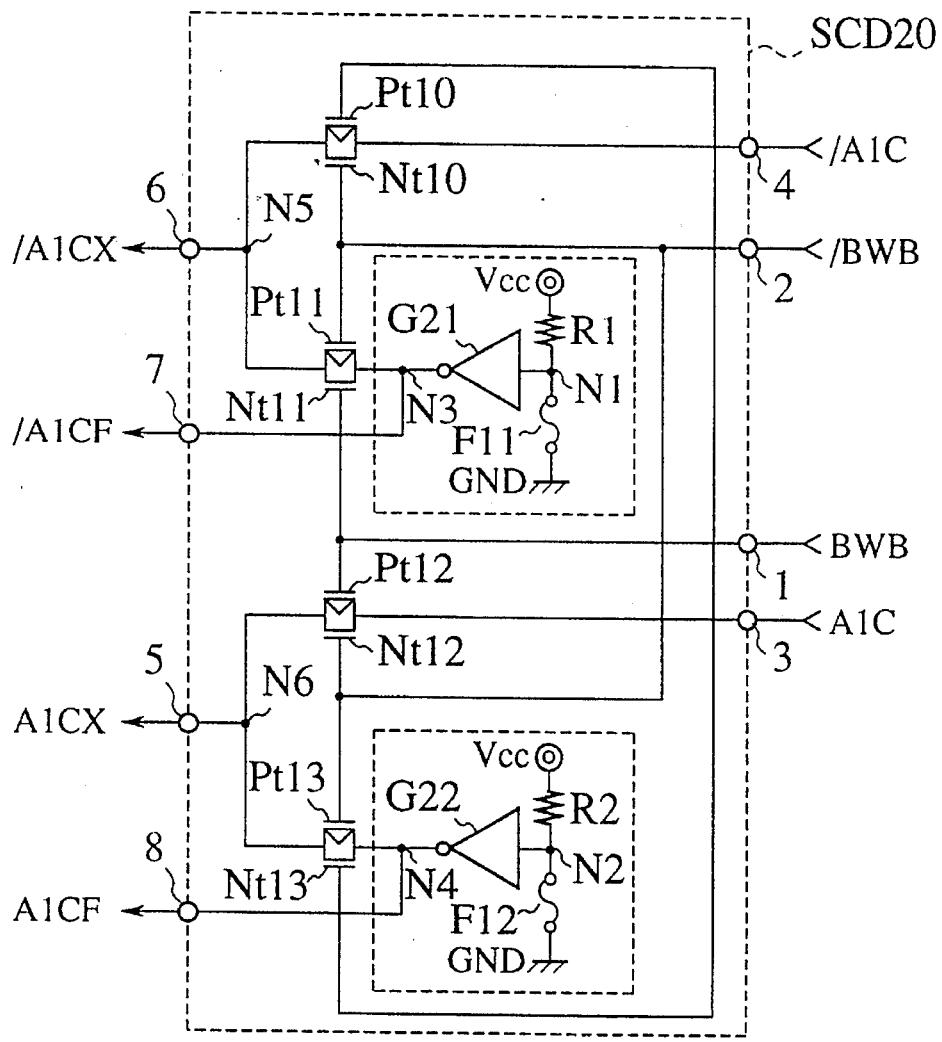
FIG. 8B is a logic circuit diagram of the second spare column decoder shown in FIG. 8A.

FIG. 8B is a logic circuit diagram of the second spare column decoder shown in FIG. 8A.

The second spare column decoder receives the block write control signals BWB and BWB/ and the column address signals A1C and /A1C as inputs.

The potential level of the output (address proportionate signal) A1CX of the second spare column decoder 20 becomes equivalent to the potential level of the column address signal /A1C or the potential level of a fuse circuit output signal /A1CF based on the potential level of the block write system control signal BWB.

The fuse circuit output signals /A1CF and A1CF are the outputs of inverters G21 and G22 connecting the first and second nodes N1 and N2. The nodes N1 and N2 are connected to the positive power source Vcc at the high resistances R1 and R2, and are also connected to a standard power source GND via the fuses F11 and F12.

Figure 6A:
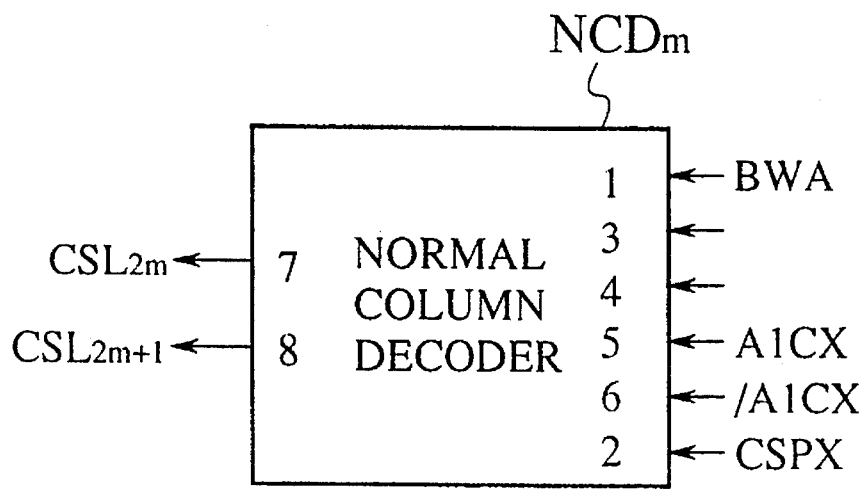
FIG. 6A is a circuit symbol diagram of a normal column decoder used in the semiconductor memory device shown in FIG. 5A.

FIG. 6A is a circuit symbol diagram of a normal column decoder used in the semiconductor memory device shown in FIG. 5A.

Figure 6B:
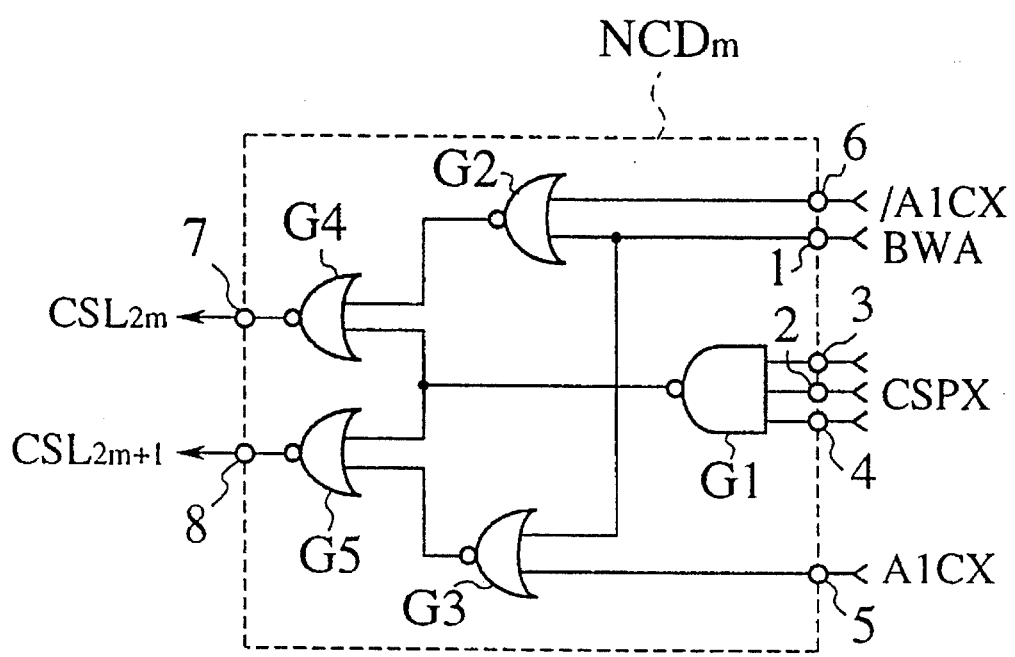
FIG. 6B is a logic circuit diagram of the normal column decoder shown in FIG. 6A.

FIG. 6B is a logic circuit diagram of the normal column decoder shown in FIG. 6A.

The normal column decoder NCD shown in FIGS. 6A and 6B has the same circuit configuration as in the conventional example.

However, whereas the input for the conventional example is the column address signals A1C and /A1C, the block write mode signal BW, and the normal column decoder control signal CSP, for the present embodiment various address signals A1CX and /A1CX, a block write control signal BWA, and the normal column decoder control signal CSPX are used.

Figure 9A:
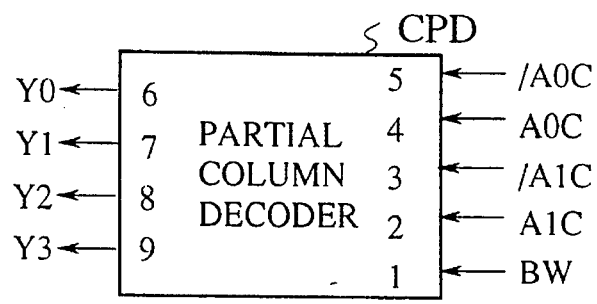
FIG. 9A is a circuit symbol diagram of a partial column decoder CPD as shown in FIG. 5A.

FIG. 9A is a circuit symbol diagram of a partial column decoder CPD as shown in FIG. 5A.

Figure 9B:
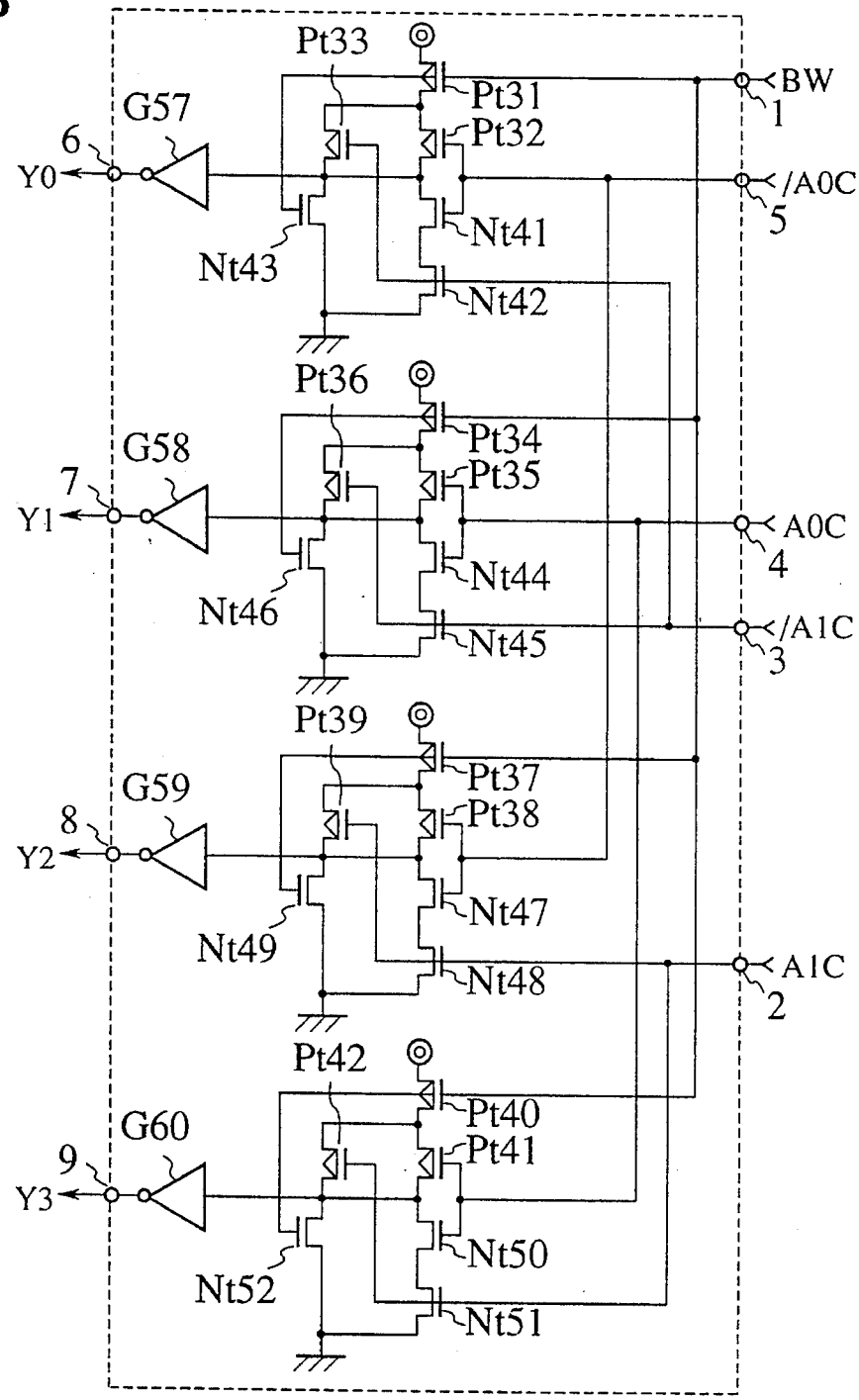
FIG. 9B is a logic circuit diagram of the partial column decoder shown in FIG. 9A.

FIG. 9B is a logic circuit diagram of the partial column decoder shown in FIG. 9A.

The last two bits A1C and A0C in a column address signal are converted to partial column decoding address signals Y0 to Y3 by a partial column decoder CPD shown in FIGS. 9A and 9B and transmitted to a DQ buffer 100, then one pair is selected from four decoder line pairs 50.

The partial column decoder CPD receives the second to last bit A1C in a column address signal together with a block write mode signal BW, which changes to a high potential level during only the block write mode.

In addition, as can be understood from FIGS. 9A and 9B, during the block write mode, the data from the write-in data line 20 is transmitted to four data line pairs 50 without being decoded in the DQ buffer 100, irrespective of the lowest two bits A1C and/A1C in the column address signals, because the partial column decoder address signals Y0 to Y3 supplied to the DQ buffer 100 are all at the high potential. At this time, the column selection line CSL2m and the column selection line CSL2m+1 are selected together so that the write-in data is finally written into the four columns. In this case, four of the data line pairs DQ0 to DQ3 are charged and discharged together.

Figure 10:
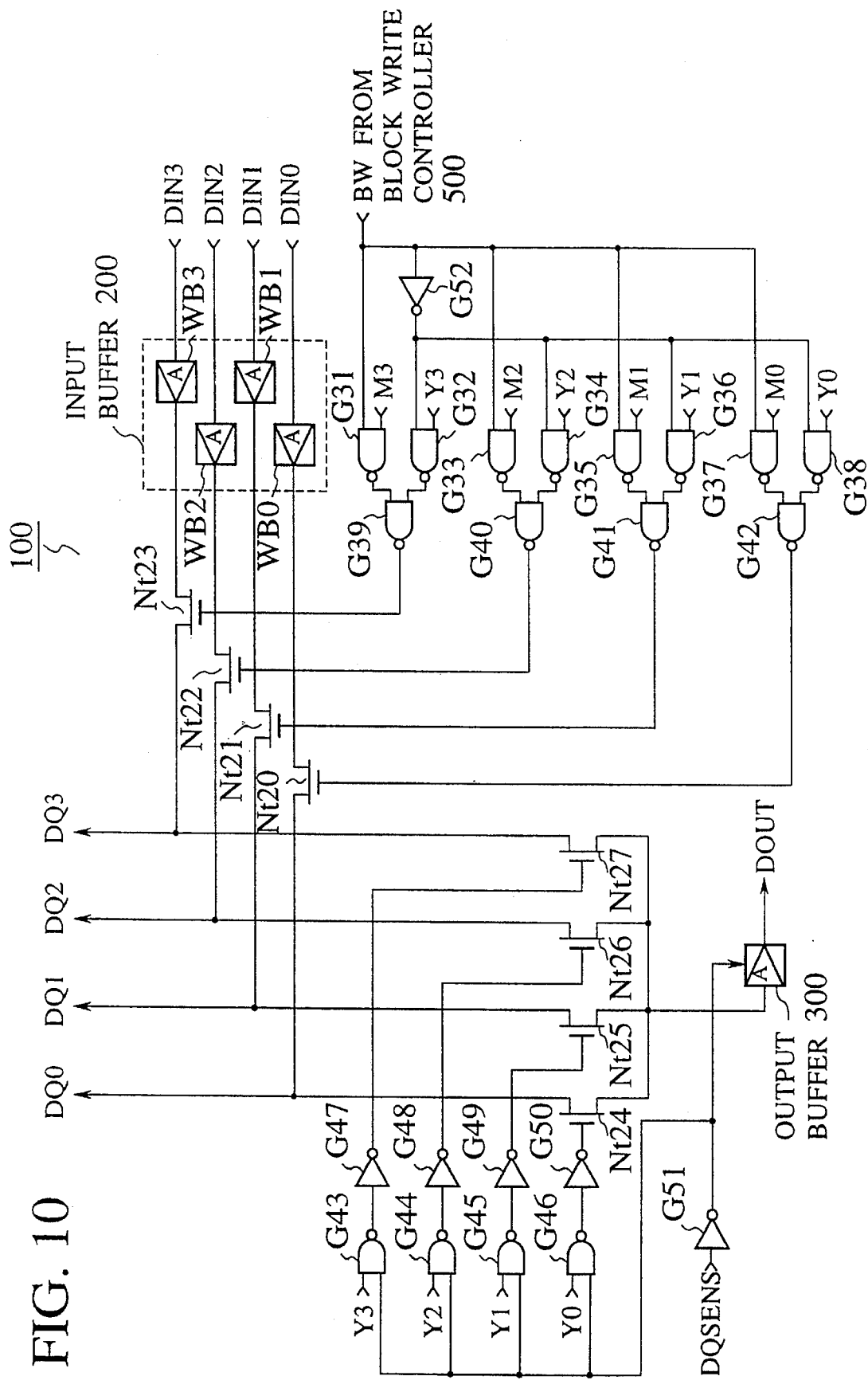
FIG. 10 is a logic circuit diagram for a DQ buffer used in the semiconductor memory device shown in FIG. 5A.

FIG. 10 is a logic circuit diagram for a DQ buffer 100 used in the semiconductor memory device shown in FIG. 5A.

The DQ buffer 100 controls the input and output of data on the data line pairs (DQ0 to DQ3) based on the partial column decode addresses Y0 to Y3 transmitted from the partial column decoder PCD, mask control signals M0 to M3, the block write mode signal BW transmitted from a block write control circuit (block write controller) 500, and a data line sense signal DQSENS. The block write controller 500 receives a row address strobe signal/RAS, a column address strobe signal /CAS, a write enable signal /WE, an output enable signal /OE, and a signal DSF transmitted from external devices and generates the block write mode signal BW which is supplied to the partial column decoder CPD, the column decoders NCD0, . . . , NCD3, and the spare column decoder SCD.

The mask control signal Mj (where j=0 to 3) is significant during the block write mode, and selects the column for masking in the block. Specifically, write-in is possible when the mask control signal Mj is at the high potential level, and is not possible when this signal is at the low potential level.

The DQ buffer comprises four write buffers (WB0 to WB3), and connect write-in data lines DIN0 to DIN3 all of which have a same value in a case of a normal one bit write-in mode. In addition, these data lines DIN0 to DIN3 are also the same during the block write mode. However, in principle, each of the write-in data lines DIN0 to DIN3 can have an optional value.

The data line sense signal DQSENS changes from a low potential level to a high potential level during read-out, and selects one of the data pairs DQ0 to DQ3 corresponding to the partial column decode addresses Y0 to Y3 and amplifies the selected one.

Figure 11:
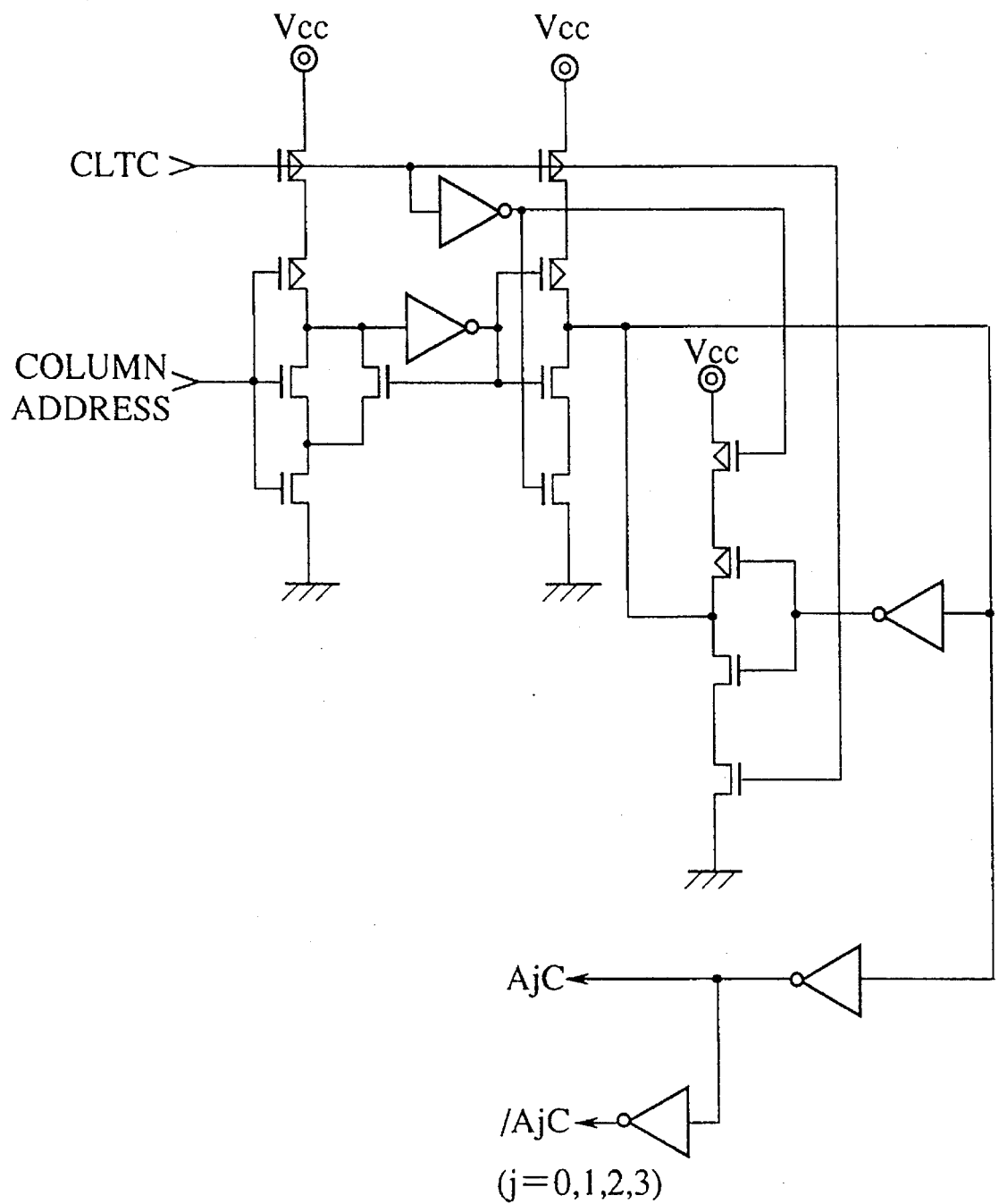
FIG. 11 is a logic circuit diagram of a column address buffer shown in FIG. 5A.

FIG. 11 is a logic configuration diagram of the column address buffer 400. The column address buffer 400 receives a column address and a column address latch signal CLTC and generates control signals AjC and /AjC (j=0, 1, 2, 3), and transmits them to the normal column decoders NCD0 to NCD3, the first spare column decoder SCD10, the second spare column decoder SCD20, and the partial column decoder CPD.

Operations under various operation modes of the semiconductor memory device of the present invention will now be explained with reference to FIGS. 5 to 9.

For simplicity, we assume a case where address A3C to A0C="0000B" in order to access a normal column COL0).

In this case where a defective column is present, it is assumed that the defect is generated in the normal column COL0. The operations will be described for the following four situations (1) to (4).

(1) In a case that there is no defective column in one-bit read-write mode

Because there is no defective column address, none of the fuses F1a to F3b, and F11 and F12 of the first spare column decoder SCD10 and the second spare column decoder SCD20 is cut. Also, the signal BW is at low potential level because the block write mode is not selected.

When a column address A3C to A0C ="0000B" is provided, the NOR node /N in the first spare column decoder SCD10 changes to the low potential level after being charged by the spare column decoder internal node charging signal PRCH. For this reason, in accordance with the logic shown in FIG. 7B, the normal column decoder control signal CSPX and the block write control signals BWA and BWB change to high, low, and low potential levels respectively.

In addition, the first and second nodes N1 and N2 in the second spare column decoder SCD20 are connected to the positive power source Vcc through the high resistances R1 and R2. Also, because the fuses F11 and F12 of the second spare column decoder SCD20 are not cut, the nodes N1 and N2 have a low potential level close to the standard potential GND. As a result, fuse circuit output signals A1CF and /A1CF change to the positive power source potential Vcc, or, specifically, to the high potential level. However, because the block write system control signal BWB is at the low potential, the address proportionate signal A1CX is at the low potential level and the signal /A1CX is at the high potential level, in accordance with the column address signal A1C="0B".

Accordingly, neither of the spare columns selection lines SCSOL0 and SCSOL1 which connect the spare columns SCOL0 and SCOL1 are selected at the low potential, and, on the normal column section, only the column selection line CSL0 changes to the high potential level and is selected. Accordingly, the gates of the switch transistor Ntr0 and Ntr1 changes to the high potential by the column selection line CSL0, and the normal columns COL0 and COL1 are connected to the data line pairs DQ0 and DQ1. The decoding is completed by the column address signal A0C in the DQ buffer 100. The decoding operation in the DQ buffer 100 is the same as for the conventional example, therefore the details are omitted here.

In this manner, in the case where there is no defective column and a one-bit read-write mode, one column selection line from among the column selection lines CSL0 to CSL7 is selected. As a result, two normal columns are selected and the decoding is finally completed by the DQ buffer 100 to select one of the two normal columns.

(2) In a case that there is no defective column in the block write mode

Because there is no defective column address, none of the fuses of the first spare column decoder SCD10 and the second spare column decoder SCD20 is cut. Also, the signal BW is at high potential level because the block write mode is selected.

Because the transistors Ftr0 and Ftr1 whose gate receive the reverse signal /BW are OFF, when the column address signals A3C, A2C="00B" are provided, the NOR node /N in the first spare column decoder SCD10 changes to the low potential level after being charged by the spare column decoder internal node charging signal PRCH, regardless of the potential of the column addresses A1C and /A1C. Because of this, the normal column decoder control signal CSPX and the block write system control signals BWA and BWB change to high, high, and low potential levels respectively, in accordance with the logic in the configuration of the first spare column decoder SCD10 as shown in FIGS. 7A and 7B.

In addition, the first and second nodes N1 and N2 in the second spare column decoder SCD20 are connected to the positive power source Vcc through the high resistances R1 and R2, respectively. Because the fuses F11 and F12 in the second spare column decoder SCD20 are not cut, the nodes N1 and N2 keep a low potential level close to the standard potential GND. As a result, the fuse circuit output signals A1CF and /A1CF change to the positive power source potential Vcc, or, specifically, to the high potential level. However, because the block write control signal BWB is at the low potential level and the column address signals A1C and /A1C are both at an undetermined potential level, the address signals A1CX and /A1CX are also at an undetermined potential level.

Accordingly, neither of the spare columns selection lines SCSL0 and SCSL1 which connect the spare columns SCOL0 and SCOL1 are selected because these have the low potential level. On the other hand, in the normal column section, both the column selection lines CSL0 and CSL1 change to the high potential level and these are selected, regardless of the values of the address signals A1CX and /A1CX, because the block write control signal BWA is at the high potential level.

Because we suppose the block write mode for this case, the decoding is not performed by the DQ buffer 100, and the write-in data is written into the normal columns COL0 to COL3 via the switch transistors Ntr0 to Ntr3 whose gates connect the column selection lines CSL0 to CSL1.

The decoding operation by the DQ buffer 100 is the same as for the conventional example shown in FIG. 1, therefore the details are omitted here.

In this manner, in the case that there is no defective column in the block write mode, two column selection lines among the column selection lines CSL0 to CSL7 are selected. As a result, four normal columns are selected.

(3) In a case that there is a defective column in the one-bit read-write mode

Because there is a defective column address, the fuses in the first spare column decoder SCD10 and the second spare column decoder SCD20 are cut in the following manner. Specifically, in the first spare column decoder SCD10, the fuses F1a, F2a, and F3a connected to the column address signals /A1C, /A2C, and /A3C sides are cut so that the NOR node /N is at the high potential level when the defective address signal lines A3C to A1C="000B" are received. In addition, only the fuse F11 on the first node N1 side (the column address /A1C side) in the second spare column decoder SCD20 is cut.

Because the block write mode is not selected, the signal BW is at the low potential level. Because the transistors Ftr0 and Ftr1 whose gates receives the reverse signal /BW are ON, when the column addresses A3C to A0C="0000B" are supplied, the NOR node /N in the first spare column decoder SCD10 keeps at the high potential level even after being charged by the spare column decoder internal node charging signal PRCH. For this reason, all of the normal column decoder control signal CSPX and the block write control signals BWA and BWB change to the low potential level, in accordance with the logic of the configuration as shown in FIG. 7B.

In addition, the second node N2 in the second spare column decoder SCD20 is connected to the positive power source Vcc through the high resistance R2. Because the fuse F12 is not cut, the node N2 appears to be at a low potential level close to the standard potential GND. Because the fuse F11 is cut, the first node N1 appears to be at the potential level of positive power source Vcc, specifically, at the high potential level. As a result, the fuse circuit output signals A1CF and /A1CF change to the high potential level and the low potential level respectively. However, because the block write control signal BWB is at the low potential level, the address signal A1CX is at the low potential level and the signal /A1CX is at the high potential level in accordance with the column address A1C="0B".

Because the normal column decoder control signal CSPX is at the low potential level, the column selection lines CSL0 to CSL7 connected to the normal column section are not selected. In addition, because the NOR node /N is at the high potential level, the fuse circuit output signal A1CF is at the high potential level and the signal /A1CF is at the low potential level, the spare column selection line SCSL0 is selected at the high potential level. In accordance with this, switching transistors Str0 and Str1 are ON, and the spare columns SCOL0 and SCOL1 are connected to the data line pairs DQ0 and DQ1. The decoding is completed using the column address A0C by the DQ buffer 100. The decoding operation by the DQ buffer 100 is the same as for that of the conventional example, therefore the details are omitted here.

In this manner, in the case where there is a defective column in the one-bit read-write mode, one column selection line among the spare column selection lines SCSL is selected. As a result, two spare columns are selected and the decode operation is completed by the DQ buffer 100.

(4) In a case that there is a defective column in the block write mode

Because there is a defective column address, the fuses in the first spare column decoder SCD10 and the second spare column decoder SCD20 are cut. The cutting of the fuses occurs in the same manner as described above in (3) "In a case that there is a defective column in the one-bit read-write mode". However, because the block write mode is activated, the block write signal BW is at the high potential level and the reverse signal /BW is at the low potential level. The values of immaterial input (column address) A1C and /A1C have no effect on the outputs of the normal column decoders SCD0 to SCD7.

When the column addresses A3C, A2C="00B" are received, the NOR node /N in the first spare column decoder SCD10 keeps at the high potential level even after being charged by the spare column decoder internal node charging signal PRCH. Because of this, the normal column decoder control signal CSPX and the block write system control signals BWA and BWB change to high, low, and high potential levels, respectively, in accordance with the logic of the configuration as shown in FIG. 7B.

In addition, the second node N2 is connected to the positive power source Vcc through the high resistance R2. Because the fuse F12 is not cut, the node N2 appears to be at a low potential level close to the standard potential GND. Also, because the fuse F11 is cut, the first node N1 appears to be at the potential level of the positive power source Vcc, specifically, at the high potential level. As a result, the fuse circuit output signals A1CF and /A1CF are at the high and the low potential levels, respectively. Further, because the block write control signal BWB is at the high potential level, the address signal A1CX is at the high potential level and the signal /A1CX is at the low potential level.

Because the NOR node /N is at the high potential level, the fuse circuit output signal A1CF is at the high potential level, the signal /A1CF is at the low potential level, and the spare column selection line SCSL0 is selected at the high potential level. In accordance with this, the switching transistors Str0 and Str1 are ON, and the spare columns SCOL0 and SCOL1 are connected to the data line pairs DQ0 and DQ1 respectively. Specifically, among the four columns required for the block write operation, two columns which include the defective column are exchanged for spare columns.

In addition, because the normal column decoder control signal CSPX, the block write control signal BWA, and the address signals A1CX and /A1CX are at the high potential level, the low potential level, the high potential level, and the low potential level, respectively, only the normal column selection line CSL1 is selected at the high potential level. In accordance with this, the switching transistors Ntr2 and Ntr3 are turned ON, and the normal columns COL2 and COL3 are connected to the data line pairs DQ2 and DQ3 respectively. Specifically, among the four columns required for the block write operation, the remaining two columns in the normal column section which do not include the defective column, therefore, are selected.

Because the block write mode is selected in this case, the decoding operation is not carried out in the DQ buffer 100, and the write-in data is written into the spare columns SCOL0 and SCOL1 and the normal columns COL2 and COL3 via the switch transistors Str0, Str1, Ntr2, and Ntr3, respectively. The operation relating to the decoding by the DQ buffer 100 is the same as for the conventional example shown in FIG. 1, therefore the details are omitted here.

In this manner, in the case that there is a defective column in the block write mode, the spare column selection line SCSL and the column selection lines CSL are selected, and two each of the spare columns and normal columns are selected.

As described in detail in the foregoing explanations, by using the semiconductor memory device of the present invention, it is possible to provide a low-cost semiconductor memory device wherein, by making the number of spare columns the same as the number of columns connected to one column selection line, the increase in spare columns and a chip areas can be decreased.

Also, by means of the semiconductor memory device of the present invention, depending on whether or not the device is in the block write mode and whether or not a defective column is present, by changing the control of the column address decoding system and the DQ buffer system, specifically, in the case where there is a defective column under the block write mode, and by dividing the column selection lines for accessing the necessary columns into normal column selection lines and spare column selection lines, a low cost semiconductor memory device can be provided whereby it is possible to reduce the necessary number of spare columns to less than half of the number of columns conventionally necessary for the block write mode per one I/O, and whereby the increase in chip area can be decreased, corresponding to the block write mode.

While the above provides a full and complete disclosure of the preferred embodiments of the present invention, various modifications, alternate constructions and equivalents may be employed without departing from the true spirit and scope of the invention. Therefore the above description and illustration should not be constructed as limiting the scope of the invention, which is defined by the appended claims.

What is claimed is:

1. A semiconductor memory device comprising:

a first bit line pair;

a second bit line pair;

a third bit line pair;

a first data line pair;

a second data line pair;

a first transistor pair for selectively coupling the first bit line pair to the first data line pair;

a second transistor pair for selectively coupling the second bit line pair to the second data line pair;

a third transistor pair for selectively coupling the third bit line pair to the first data line pair;

a fourth transistor pair for selectively coupling the third bit line pair to the second data line pair;

a first selection line connected to the first transistor pair for controlling the first transistor pair;

a second selection line connected to the second transistor pair for controlling the second transistor pair;

a third selection line connected to the third transistor pair for controlling the third transistor pair; and a fourth selection line connected to the fourth transistor pair for controlling the fourth transistor pair.

2. The semiconductor memory device as defined in claim 1, wherein the first bit line pair and the second bit line pair are normally selected, but if either the first bit line pair or the second bit line pair is replaced, the third bit line pair is selected instead of the replaced bit line pair.

3. The semiconductor memory device as defined in claim 1, further comprising a decoder including a plurality of fuses, the decoder operating to replace one pair of the first bit line pair and the second bit line pair with the third bit line pair.

4. A semiconductor memory device as claimed in claim 1, further comprises a sense amplifier circuit provided on each of the first to third bit line pairs, the sense amplifier circuit comprises a first pair of transistors including a first transistor and a second transistor, and a second pair of transistors including a third transistor and a fourth transistor, each of the first pair of transistors and the second pair of transistors are connected between each of the first to third bit line pairs, gates of the first and third transistors are connected to one of bit lines in each of the first to third bit line pairs, and gates of the third and fourth transistors are connected to the other bit line in each of the first to third bit line pairs.

5. A semiconductor memory device as claimed in claim 1, further comprises an equalizer circuit provided on each of the first to third bit line pairs, the equalizer circuit comprises first and second transistors which are connected in series, the first transistor is connected to one of bit lines in each of the first to third bit line pairs, and the second transistor is connected to the other bit line in each of the first to third bit line pairs.

6. A semiconductor memory device as claimed in claim 1, further comprises a plurality of memory cells, each of the plurality of memory cells is connected to each bit line in each pair of the first to third bit line pairs.

7. A semiconductor memory device as claimed in claim 6, further comprises a plurality of word line pairs, one word line in each pair of the word line pairs is connected to the one memory cell connected to the one bit line in each pair of the first to third bit line pairs.

8. The semiconductor memory device as defined in claim 6, wherein each of the plurality of memory cells includes one transistor and one capacitor.

9. A semiconductor memory device as claimed in claim 1, further comprises a spare column decoder, the spare column decoder comprising:

a plurality of input terminals through which the column address is received;

a common line, a plurality of fuses connected between the common line and the plurality of input terminals; and a plurality of transistors, each transistor connected between each of the plurality of fuses in series and each of the plurality of input terminals, wherein the spare column decoder receives a column address and generates a bit line selection control signal to select following cases (1) to (3), which are determined by cutting the plurality of fuses, through the first to fourth selection lines according to a voltage potential level of the common line:

(1) both the first bit line pair and the second bit line pair, (2) both the first bit line pair and the third bit line pair, and (3) both the second bit line pair and the third bit line pair.

10. A semiconductor memory device as claimed in claim 1, further comprises a buffer, the buffer comprises:

an output buffer for temporarily storing data to be transmitted to an external device;

fifth transistor pair provided between the first data line pair and the output buffer;

sixth transistor pair provided between the second data line pair and the output buffer;

an input buffer for temporarily storing data to be transmitted to the first or second data line pair;

seventh transistor pair provided between the first data line pair and the input buffer; and eighth transistor pair provided between the second data line pair and the input buffer, wherein data is transferred to/from the first data line pair, the second data line pairs, or both of the first data line pair and the second data line pair, by switching ON/OFF of the fifth to eighth transistor pairs.

11. A semiconductor memory device as claimed in claim 1, further comprises a column address buffer for receiving a column address and a column address latch signal and generates control signals during a low level of the column address latch signal and transmits the control signals to the first to fourth selection lines.

12. The semiconductor memory device as defined in claim 1, further comprising:

a fourth bit line pair;

a fifth bit line pair;

a sixth bit line pair;

a third data line pair;

a fourth data line pair;

a fifth transistor pair for selectively coupling the fourth bit line pair and the third data line pair, the fifth transistor pair connected to the first selection line so as to be controlled by the first selection line;

a sixth transistor pair for selectively coupling the fifth bit line pair and the fourth data line pair, the sixth transistor pair connected to the second selection line so as to be controlled by the second selection line;

a seventh transistor pair for selectively coupling the sixth bit line pair and the third data line pair, the seventh transistor pair connected to the third selection line so as to be controlled by the third selection line; and an eighth transistor pair for selectively coupling the sixth bit line pair and the fourth data line pair, the eighth transistor pair connected to the fourth selection line so as to be controlled by the fourth selection line.

13. The semiconductor memory device as defined in claim 12, further comprising:

a first decoder including a plurality of fuses, the first decoder operating to replace one pair of the first bit line pair and the second bit line pair with the third bit line pair; and a second decoder including a plurality of fuses, the second decoder operating to replace one pair of the fourth bit line pair and the fifth bit line pair with the sixth bit line pair.

14. The semiconductor memory device as defined in claim 12, further comprising:

an output buffer for temporarily storing data to be transmitted to an external device;

a ninth transistor pair coupled between the first data line pair and the output buffer, the ninth transistor pair being controlled by a first column address signal;

a tenth transistor pair coupled between the second data line pair and the output buffer, the tenth transistor pair being controlled by a second column address signal;

eleventh transistor pair coupled between the third data line pair and the output buffer, the eleventh transistor pair being controlled by a third column address signal; and a twelfth transistor pair coupled between the fourth data line pair and the output buffer, the twelfth transistor pair being controlled by a fourth column address signal.

15. The semiconductor memory device as defined in claim 12, further comprising:

first to fourth input buffers for temporarily storing data to be transmitted to the first to fourth data line pairs;

a ninth transistor pair coupled between the first data line pair and the first input buffer, the ninth transistor pair being controlled by a first column address signal;

a tenth transistor pair coupled between the second data line pair and the second input buffer, the tenth transistor pair being controlled by a second column address signal;

an eleventh transistor pair coupled between the third data line pair and the third input buffer, the eleventh transistor pair being controlled by a third column address signal; and a twelfth transistor pair coupled between the fourth data line pair and the fourth input buffer, the twelfth transistor pair being controlled by a fourth column address signal.

16. A method for replacing bit line pairs in a semiconductor memory device including:

a first bit line pair;

a second bit line pair;

a third bit line pair;

a first data line pair;

a second data line pair;

a first transistor pair for selectively coupling the first bit line pair and the first data line pair;

a second transistor pair for selectively coupling the second bit line pair and the second data line pair;

a third transistor pair for selectively coupling the third bit line pair and the first data line pair; and a fourth transistor pair for selectively coupling the third bit line pair and the second data line pair, the method comprising the steps of:

coupling the second bit line pair and the second data line pair and coupling the third bit line pair and the first data line pair by turning on the second transistor pair and the third transistor pair in response to control signals when the first bit line pair is replaced with the third bit line pair, and coupling the first bit line pair and the first data line pair and coupling the third bit line pair and the second data line pair by turning on the first transistor pair and the fourth transistor pair in response to control signals when the second bit line pair is replaced with the third bit line pair.

17. The method for replacing bit line pairs in a semiconductor memory device as defined in claim 16, further comprising the steps of:

selecting one pair of the first data line pair and the second data line pair;

amplifying data from the selected one pair of the first data line pair and the second data line pair; and outputting the amplified data.

18. The method for replacing bit line pairs in a semiconductor memory device as defined in claim 16, further comprising the steps of:

amplifying a first input data and a second input data; and supplying the amplified first and second input data to the first data line pair and the second data line pair, respectively.

19. A method for replacing bit line pairs in a semiconductor memory device including:

a first bit line pair;

a second bit line pair;

a third bit line pair;

a fourth bit line pair;

a fifth bit line pair;

a sixth bit line pair;

a first data line pair;

a second data line pair;

a third data line pair;

a fourth data line pair;

a first transistor pair for selectively coupling the first bit line pair and the first data line pair;

a second transistor pair for selectively coupling the second bit line pair and the second data line pair;

a third transistor pair for selectively coupling the third bit line pair and the first data line pair;

a fourth transistor pair for selectively coupling the third bit line pair and the second data, line pair;

a fifth transistor pair for selectively coupling the fourth bit line pair and the third data line pair;

a sixth transistor pair for selectively coupling the fifth bit line pair and the fourth data line pair;

a seventh transistor pair for selectively coupling the sixth bit line pair and the third data line pair; and an eighth transistor pair for selectively coupling the sixth bit line pair and the fourth data line pair, the method comprising the steps of:

coupling the second bit line pair and the second data line pair, coupling the third bit line pair and the first data line pair, coupling the fourth bit line pair and the third data line pair, and coupling the fifth bit line pair and the fourth data line pair, by turning on the second transistor pair, the third transistor pair, the fifth transistor pair, and the sixth transistor pair in response to control signals when the first bit line pair is replaced with the third bit line pair;

coupling the first bit line pair and the first data line pair, coupling the third bit line pair and the second data line pair, coupling the fourth bit line pair and the third data line pair, and coupling the fifth bit line pair and-the fourth data line pair by turning on the first transistor pair, the fourth transistor pair, the fifth transistor pair, and the sixth transistor pair in response to control signals when the second bit line pair is replaced with the third bit line pair;

coupling the first bit line pair and the first data line pair, coupling the second bit line pair and the second data line pair, coupling the sixth bit line pair and the third data line pair, and coupling the fifth bit line pair and the fourth data line pair by turning on the first transistor pair, the second transistor pair, the sixth transistor pair, and the seventh transistor pair in response to control signals when the fourth bit line pair is replaced with the sixth bit line pair; and coupling the first bit line pair and the first data line pair, coupling the second bit line pair and the second data line pair, coupling the fourth bit line pair and the third data line pair, and coupling the sixth bit line pair and the fourth data line pair by turning on the first transistor pair, the second transistor pair, the fifth transistor pair, and the eighth transistor pair in response to control signals when the fifth bit line pair is replaced with the sixth bit line pair.

20. The method for replacing bit line pairs in a semiconductor memory device as defined in claim 19, further comprising the steps of:

selecting one pair of the first, the second, the third, and the fourth data line pairs;

amplifying data from the selected one pair of the data line pairs; and outputting the amplified data.

21. The method for replacing bit line pairs in a semiconductor memory device as defined in claim 19, further comprising the steps of:

amplifying a first, a second, a third, and a fourth input data; and supplying the amplified first through fourth input data to the first to fourth data line pairs, respectively.

* * * * *